United States Patent
Aota et al.

(10) Patent No.: US 7,582,185 B2
(45) Date of Patent: Sep. 1, 2009

(54) PLASMA-PROCESSING APPARATUS

(75) Inventors: Yukito Aota, Kanagawa (JP); Masahiro Kanai, Tokyo (JP); Atsushi Koike, Kanagawa (JP); Tomokazu Sushihara, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 184 days.

(21) Appl. No.: 10/745,604

(22) Filed: Dec. 29, 2003

(65) Prior Publication Data

US 2004/0163593 A1  Aug. 26, 2004

(30) Foreign Application Priority Data

Dec. 26, 2002 (JP) ............... 2002-376223

(51) Int. Cl.
*C23C 16/00* (2006.01)
*C23F 1/00* (2006.01)
*H01L 21/306* (2006.01)
*H05B 31/26* (2006.01)

(52) U.S. Cl. ............... 156/345.47; 156/345.43; 156/345.44; 156/345.46; 118/723 E; 118/723 ER; 315/111.21

(58) Field of Classification Search ............ 156/345.44, 156/345.45, 345.43; 118/723 E; 315/111.21
See application file for complete search history.

(56) References Cited

U.S. PATENT DOCUMENTS 5,478,429 A * 12/1995 Komino et al. ........... 118/723 E
6,155,202 A * 12/2000 Nakano et al. ........... 118/723 E
6,884,635 B2 * 4/2005 Parsons .................... 438/10
6,899,787 B2 * 5/2005 Nakano et al. ......... 156/345.44
6,946,401 B2 * 9/2005 Huang et al. .............. 438/706
2002/0132380 A1 * 9/2002 Nakano et al. ............ 438/14
2002/0134508 A1 * 9/2002 Himori et al. ......... 156/345.44
2003/0037881 A1 * 2/2003 Barnes et al. ......... 156/345.44
2003/0070759 A1 * 4/2003 Aota et al. ............ 156/345.43
2004/0244688 A1 * 12/2004 Himori et al. ........... 118/723 E

FOREIGN PATENT DOCUMENTS

| JP | 57-149735 | * | 9/1982 |
| JP | 1-19254 B2 | | 4/1989 |
| JP | 4-237940 | | 8/1992 |

OTHER PUBLICATIONS

English Translation of JP 57-149735 (dated Sep. 16, 1982).*

* cited by examiner

*Primary Examiner*—Parviz Hassanzadeh
*Assistant Examiner*—Rakesh K Dhingra
(74) *Attorney, Agent, or Firm*—Fitzpatrick, Cella, Harper & Scinto

(57) ABSTRACT

A plasma-processing apparatus having a high frequency power application electrode in which plasma is generated by supplying VHF power to the high frequency power application electrode. The plasma-processing apparatus has an impedance-matching equipment comprising a capacitive element and an inductive element, which are mutually connected in series. The apparatus is arranged so that the capacitive element and the inductive element of the impedance-matching equipment are symmetrical with respect to the center of the high frequency power application electrode.

8 Claims, 7 Drawing Sheets

F I G. 5(a)
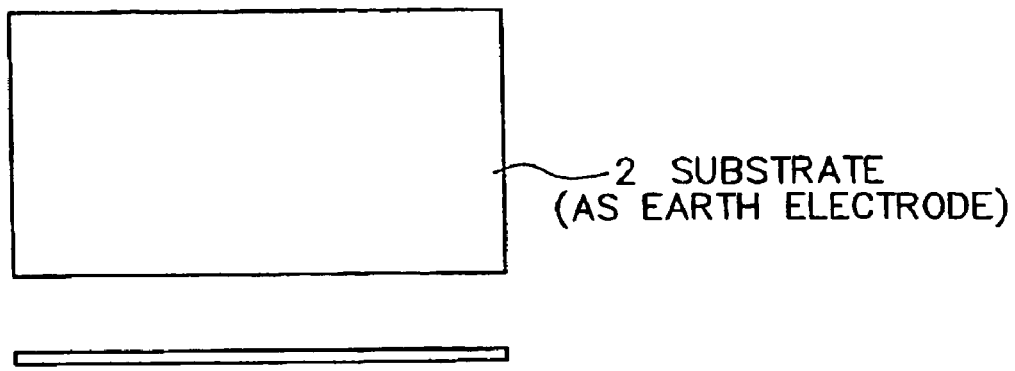
F I G. 5(b)
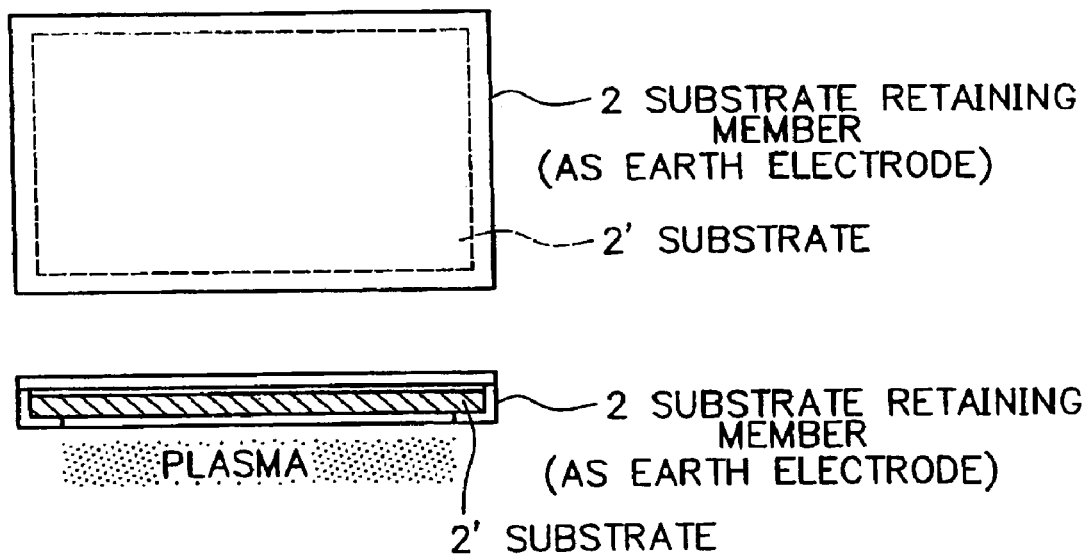

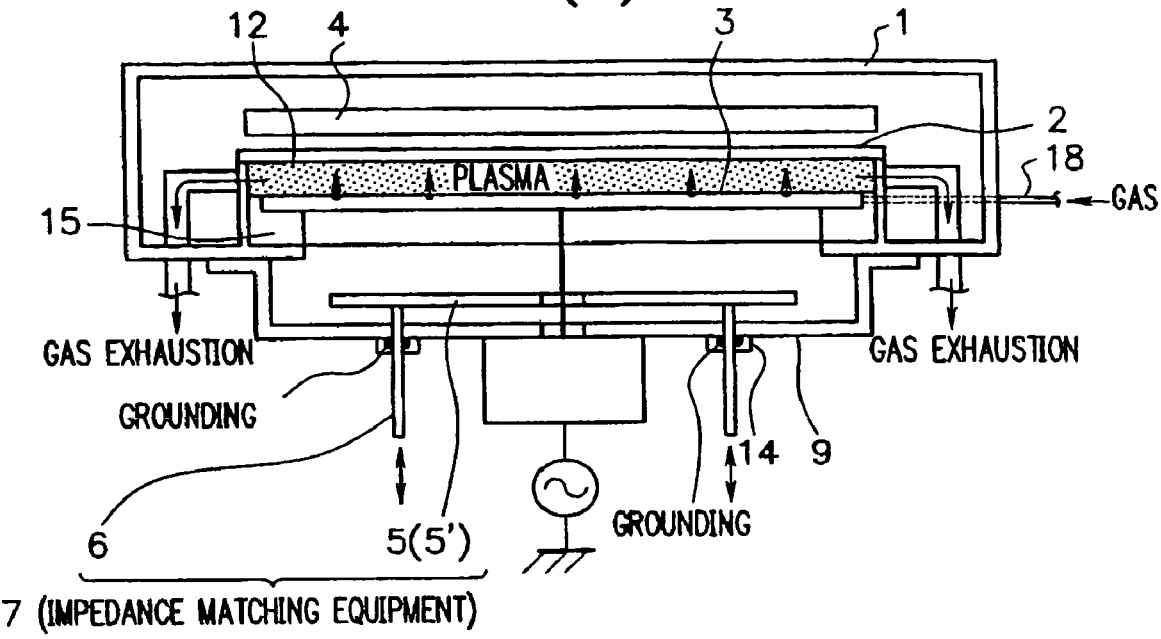
FIG. 6(a)
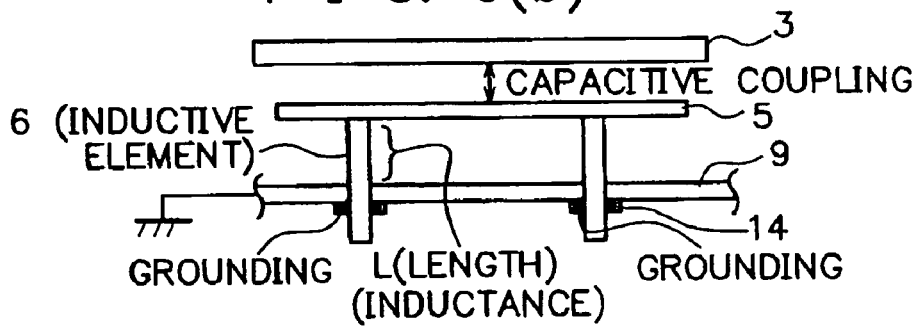
FIG. 6(b)
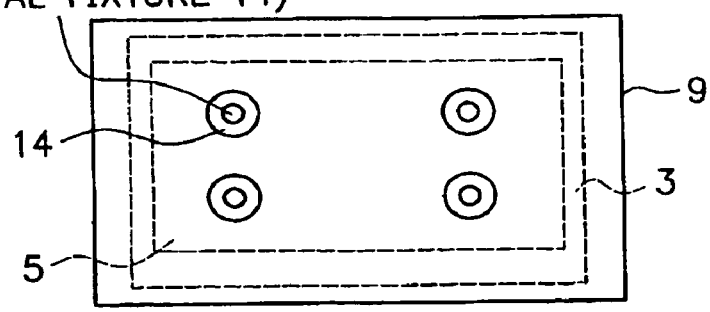

F I G. 7
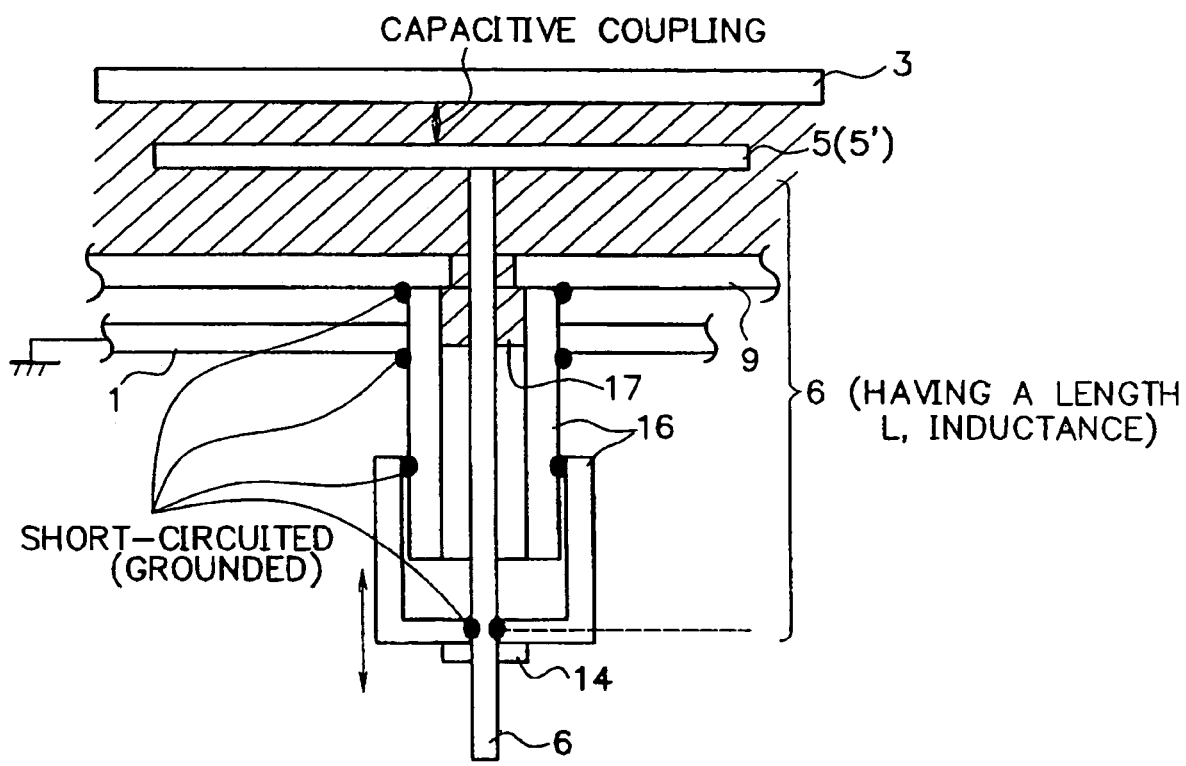

F I G. 10
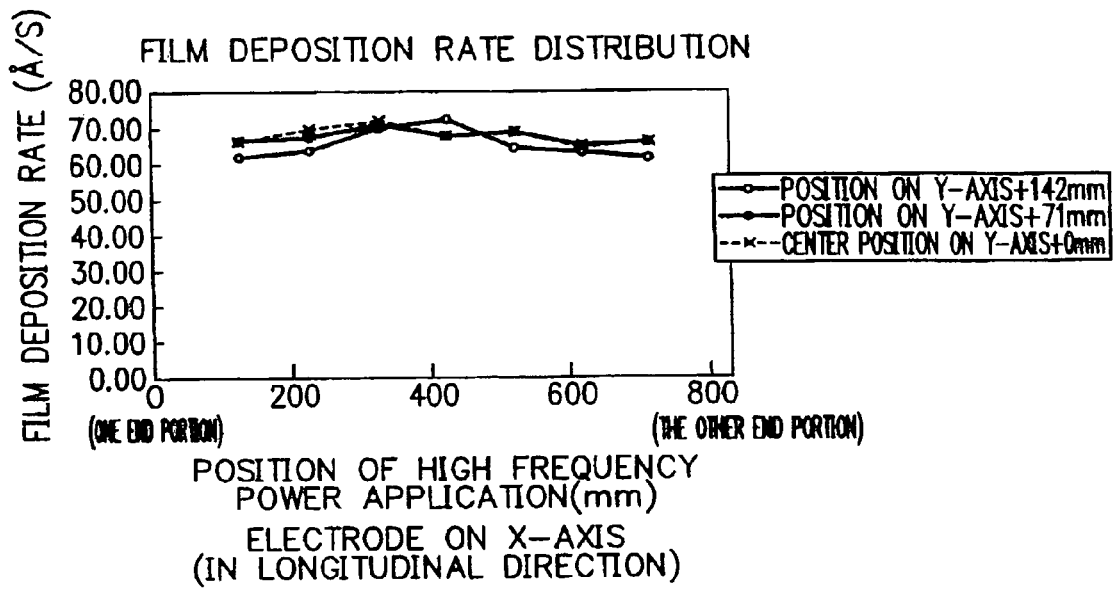
F I G. 11
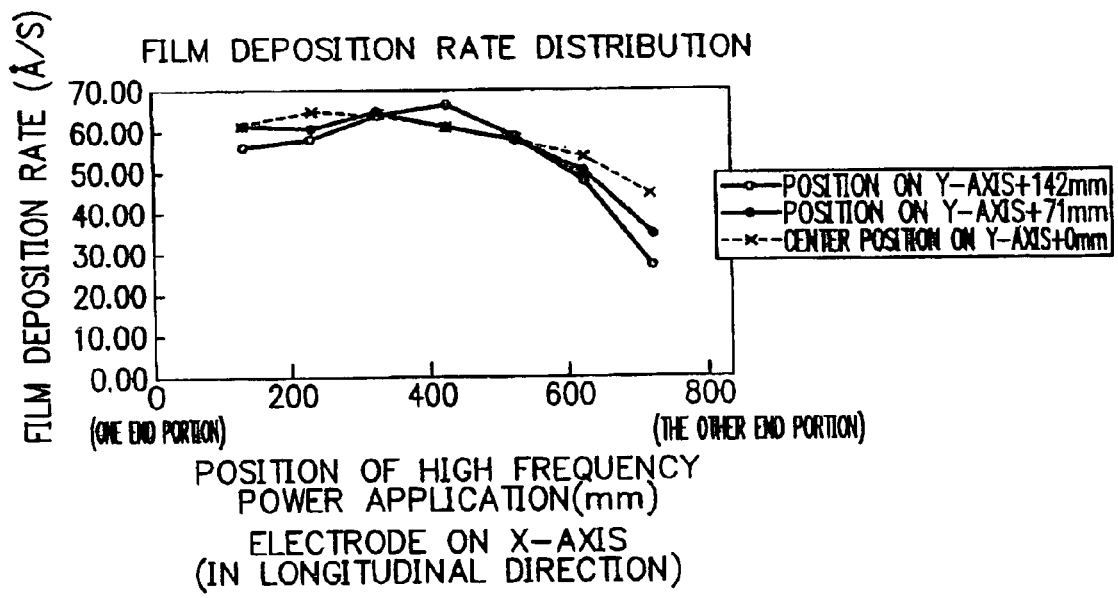

PLASMA-PROCESSING APPARATUS

BACKGROUND OF THE INVENTION

1. Field of the Invention

The present invention relates to a plasma-processing apparatus in which plasma discharge by means of a high frequency power with a frequency belonging to a very high frequency (VHF) band region (this frequency will be hereinafter simply referred to as "VHF") is used, including a plasma CVD apparatus or a plasma etching apparatus, which is used for the production of a semiconductor representatively such as an amorphous silicon series semiconductor, a crystalline silicon series semiconductor or the like.

2. Related Background Art

There are known a number of plasma-processing apparatus in which plasma discharge by means of a high frequency power is used, including a plasma CVD apparatus and a plasma etching apparatus, wherein as said high frequency power, a high frequency power with a frequency of 13.56 MHz is generally used.

In general, such a plasma-processing apparatus basically has a vacuum chamber having a reaction space formed between a high frequency power application electrode and a counter electrode (an anode) and a high frequency power source, which is connected to said high frequency power application electrode through a matching box and a power supply cable, wherein a high frequency power with a frequency of 13.56 MHz from the high frequency power source is supplied to the high frequency power application electrode and simultaneously with this, a gas is introduced into the reaction space, to cause a discharge in the reaction space to produce plasma in the reaction space, whereby an object to be plasma-processed, such as a substrate, which is arranged in the reaction space, is plasma-processed by said plasma.

In the plasma-processing apparatus, which is operated in this way, there is a tendency in that a capacitance formed between the high frequency power application electrode and the counter electrode (as an earth electrode) and that formed between the high frequency power application electrode and members (including the inner wall face of the vacuum chamber) with earth potential, which are present in the peripheries of the high frequency power application electrode, are together formed at the high frequency power application electrode. Further, in the case where an insulation member or the like, which is made of ceramic, is adopted in the electrode structure, a capacitance of a magnitude that cannot be disregarded occurs at the high frequency power application electrode.

These capacitances become such that they are equivalently connected in parallel with the resistance of the plasma impedance to lower the value of the plasma impedance to afford a capacitive load. This capacitive load increases the transmitting current in the power transmission path, where Joule heat occurs in the power supply cable and the like to increase the power loss in the high frequency power supplied to the high frequency power application electrode.

In order to solve such a problem, there are several proposals. For instance, Japanese Laid-open Patent publication No. Hei 4 (1992)-237940 (hereinafter referred to as "Document 1") discloses a manner for diminishing such Joule heat occurring in the high frequency power transmission path. Particularly, Document 1 discloses a plasma generation apparatus having a vacuum vessel and a high frequency power application electrode provided in the vacuum vessel and which is connected to a high frequency power source through a power supply cable, wherein a plasma is generated in the vacuum vessel by virtue of a high frequency power supplied to the high frequency power application electrode through the power supply cable. In this plasma generation apparatus, as the means to cancel the capacitance of the plasma impedance and the capacitance, which is formed between the high frequency power application electrode and the inner wall face of the vacuum chamber and the like that are with the earth potential, separately from the power supply cable that is connected to the high frequency power application electrode, a variable-length coaxial pipe whose tip is short-circuited by a series resonance circuit comprising LC is connected to the high frequency power application electrode as a dielectric stub for the high frequency power application electrode.

Japanese Patent Publication No. Hei 1 (1989)-19254 (hereinafter referred to as "Document 2") discloses an electrode structure capable of diminishing the capacitance formed between the high frequency power application electrode and the members (including the inner wall face of the vacuum chamber) with earth potential, which are present in the peripheries of the high frequency power application electrode. Particularly, Document 2 discloses a plasma-processing apparatus provided with an electrode structure having a pair of plane parallel plate electrodes for the application of a high frequency power, which are arranged to oppose to each other through a plasma generation region. One of the two plane parallel plate electrodes is grounded (earthed) to have the earth potential. At least one metal plate, which is insulated from the non-earthed plate electrode and also from the conductors present in the peripheries of the non-earthed plate electrode, is inserted to diminish the capacitance formed between the non-earthed plate electrode and the conductors present in the peripheries of the non-earthed plate electrode.

Document 2 describes that the electrode structure makes it possible to diminish the inter-electrode capacitance between the high frequency power application electrode and the conductors excluding the counter electrode and prevents discharge and generation of plasma at unnecessary portions.

It should be noted that in recent years, attempts have been made in order to achieve the formation of a non-crystalline (amorphous) silicon thin film or a crystalline silicon thin film on a substrate at an improved deposition rate using the plasma-processing apparatus in which a high frequency plasma generated by means of a high frequency power with a frequency of 13.56 MHz is used.

However, because the high frequency plasma generated by means of a high frequency power with a frequency of 13.56 MHz, which belongs to a HF band region, has a relatively small energy, which is incapable of achieving a high deposition rate. In fact, the deposition rate that makes it possible to deposit a high quality non-crystalline silicon film or a high quality crystalline film on a substrate is several Angstroms (Å)/sec or less.

In order to more raise the deposition rate, it is necessary to increase the density of the plasma generated. For this purpose, it is necessary to apply a large high frequency power with a frequency belonging to a VHF (very high frequency) band region or a frequency band region greater than said VHF band region to the high frequency power application electrode of the plasma CVD apparatus.

Separately, in order to further improve the productivity of a large area semiconductor device, such as a display or a solar cell in which a semiconductor comprising a crystalline silicon thin film or a non-crystalline silicon thin film is used and which excels in the quality and performance, it is necessary to uniformly deposit a crystalline silicon thin film or a non-crystalline silicon thin film, which has excellent quality and property over a large area, at an improved deposition rate.

For achieving this purpose, it is necessary to use high frequency plasma whose energy is greater than that generated by high frequency power with a frequency of 13.56 MHz, which belongs to a HF band region.

In this connection, various studies have been made in order to achieve high speed film formation over a large area using plasma generated by a large high frequency power with a very high frequency (VHF) or a frequency belonging to a microwave band region. For this purpose, it is required that such large high frequency power is supplied uniformly to the entire region of a large high frequency power application electrode having a large area so as to generate uniform plasma having a high density over a large area.

In the case where a deposited film is intended to form uniformly over a large area substrate using a plasma generated by such large high frequency power with, for instance, VHF (this plasma will be hereinafter referred to as "VHF plasma"), it is necessary to enlarge the high frequency power application electrode so that it has a larger area than the large area substrate. In this case, when the technique described in Document 1 is adopted, such problems as will be described in the following are likely to occur. When a high frequency power with a VHF (hereinafter referred to as "VHF power") is supplied to the high frequency power application electrode through the power supply cable, the Joule heat in the high frequency power transmission path is increased to greatly increase the power loss. In addition, because the inductance component is excessively large, the electric field distribution at the face of the high frequency power application electrode becomes uneven and plasma is hardly generated. Thus, it is impossible to generate uniform VHF plasma over a large area. In order to generate uniform VHF plasma over a large area using VHF power, it is necessary to consider that the VHF plasma has a larger energy than that generated by a high frequency power with a frequency of 13.56 MHz. In addition, the high frequency power application electrode through which a VHF power is supplied must be considered as a distributed constant circuit. Particularly, it is necessary to provide the position for the VHF power to be supplied to the high frequency power application electrode. In addition, it is necessary to provide an impedance-matching equipment capable of effectively diminishing the capacitance of the high frequency power application electrode. It is also necessary to determine how the impedance-matching equipment should be structured and how the impedance-matching equipment should be positioned with respect to the high frequency power application electrode.

Unless these factors are considered, it is difficult to stably and continuously generate uniform VHF plasma such that it is uniformly distributed over a large area at a uniform density, where it is almost impossible to deposit a high quality film over a large area substrate at a uniform thickness and at a high deposition rate.

Thus, in accordance with the technique described in Document 1, it is difficult to stably and continuously generate a uniform VHF plasma over a large area at a uniform density so that a high quality film can be deposited uniformly over a large area substrate at a high deposition rate.

Separately, in the case where the high frequency power application electrode is enlarged to have a large area in order to make it possible to supply a VHF power which is a large high frequency power, it is difficult to decrease the capacitance of the electrode to a sufficient level in accordance with the technique described in Document 2, where problems are likely to occur in that, particularly, the power introduction portion of the high frequency power application electrode is overheated and the high frequency power application electrode is damaged.

Thus, in accordance with the technique described in Document 2, it is also difficult to stably and continuously generate a uniform VHF plasma over a large area at a uniform density so that a high quality film can be deposited uniformly over a large area substrate at a high deposition rate.

SUMMARY OF THE INVENTION

In view of the foregoing, the present invention is aimed at providing a plasma-processing apparatus, which enables stable and continuous generation of uniform VHF plasma, such that it is uniformly distributed over a large area at a uniform density and to form a high quality deposited film, which is highly functional and free of defects, over a large area substrate at a uniform thickness and at a high deposition rate.

The functional deposited film includes a crystalline silicon series semiconductor film, a non-crystalline silicon series semiconductor film and the like.

Another object of the present invention is to provide a plasma-processing apparatus typically comprising a vacuum vessel having a reaction space formed between a high frequency power application electrode and an earth electrode, which are arranged in the vacuum vessel such that they are opposed to each other, the high frequency power application electrode having a face exposed to the reaction space, wherein a VHF power is supplied to the high frequency power application electrode to generate plasma in the reaction space, characterized in that between another face of the high frequency power application electrode excluding the face thereof exposed to the reaction space and a conductor with the earth potential comprising at least a part of the circumferential wall of the vacuum vessel, an impedance matching equipment comprising a capacitive element and an inductive element, which are mutually connected in series and arranged such that each of capacitive element and inductive element of the impedance-matching equipment becomes symmetrical to the center of the high frequency power application electrode. Here, the earth electrode comprises an electrically conductive member comprising an object to be plasma-processed such as a substrate on which a film is to be deposited.

The impedance-matching equipment is preferred to be designed such that a conductor plate that is insulated from the high frequency power application electrode in terms of direct current potential is arranged in parallel to the opposite face of the high frequency power application electrode and the inductive element is inserted between the conductor plate and the conductor with earth potential.

In this case, the conductor plate functions as the aforesaid capacitive element in relation to the high frequency power application electrode.

It is possible to expose the side of the opposite face of the high frequency power application electrode, which is not facing the reaction space, to atmospheric pressure and to arrange the impedance-matching equipment in series between the opposite face of the high frequency power application electrode and the conductor with the earth potential.

It is preferred to make the impedance-matching equipment such that it is movable in parallel to the high frequency power application electrode.

It is possible that the impedance matching equipment comprises a plurality of units comprising a capacitive element and an inductive element, which are connected in series.

The plasma-processing apparatus of the present invention, which is constituted as described above, has significant advantages in that uniform VHF plasma is stably and continuously generated, such that it is uniformly distributed in the entire region of the reaction space at a uniform density, and because of this, a high-quality deposited film, which is highly functional and free of defects, is formed over the entire surface of a large area substrate at a uniform thickness and at a high deposition rate.

BRIEF DESCRIPTION OF THE DRAWINGS

FIGS. 5(a) and 5(b) are schematic diagrams respectively illustrating an example of an earthed electrode comprising a substrate or a substrate retaining member used in any of the plasma-processing apparatus shown in FIGS. 1 to 4.

FIGS. 6(a) and 6(b) are schematic diagrams for explaining the operation and constitution of the impedance matching equipment in the plasma-processing apparatus shown in FIG. 1.

FIG. 7 is a schematic diagrams for explaining the constitution of the impedance-matching equipment in the plasma-processing apparatus shown in FIG. 3.

FIG. 10 is a graph showing deposition rate distributions of amorphous silicon films in Example 3, which will be described later.

FIG. 11 is a graph showing deposition rate distributions of amorphous silicon films in Comparative Example 1, which will be described later.

DESCRIPTION OF THE INVENTION AND PREFERRED EMBODIMENTS

The present invention achieves the foregoing objects and provides a plasma-processing apparatus typically comprising a vacuum vessel having a reaction space formed between a high frequency power application electrode and an earth electrode, which are arranged in the vacuum vessel such that they are opposed to each other. The high frequency power application electrode has a face exposed to the reaction space. VHF power is supplied to the high frequency power application electrode to generate plasma in said reaction space. In particular, between another face of the high frequency power application electrode, excluding the face exposed to the reaction space, and a conductor with the earth potential comprising at least part of the circumferential wall of the vacuum vessel, an impedance-matching equipment comprising a capacitive element and an inductive element, which are mutually connected in series, is arranged such that each capacitive element and said inductive element of the impedance-matching equipment becomes symmetrical to the center of the high frequency power application electrode. The earth electrode comprises an electrically-conductive member as an object to be plasma-processed, such as a substrate on which a film is to be deposited.

In the following, the present invention will be described in more detail with reference to the drawings.

Figure 1:
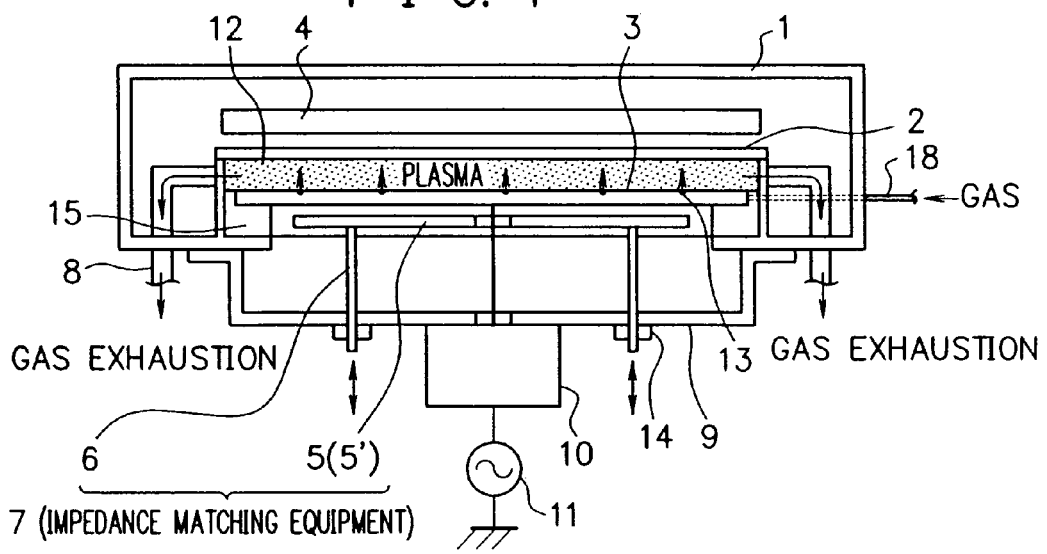
FIG. 1 is a schematic diagram illustrating the constitution of a first example of a plasma-processing apparatus of the present invention.
Figure 2:
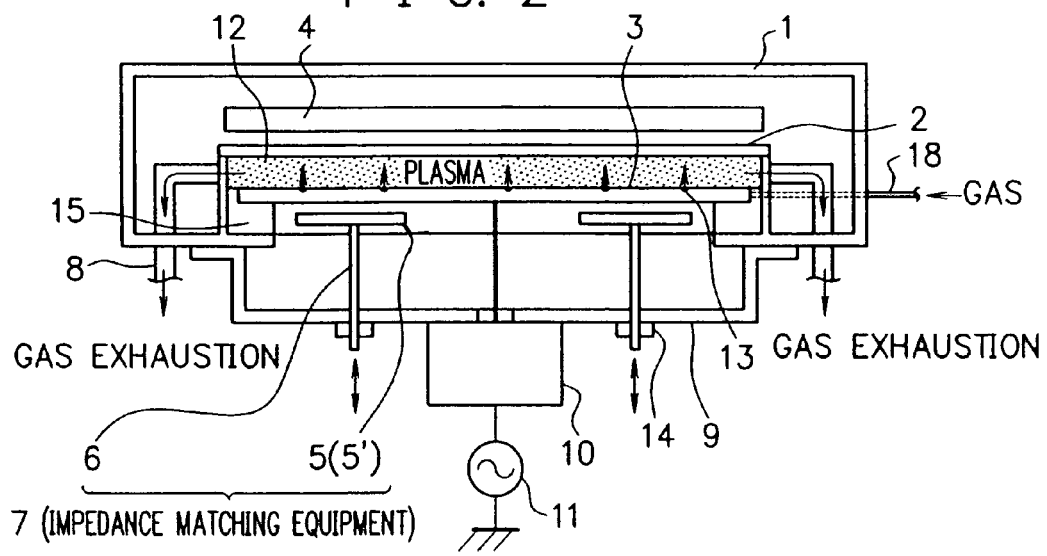
FIG. 2 is a schematic diagram illustrating the constitution of a second example of a plasma-processing apparatus of the present invention.
Figure 3:
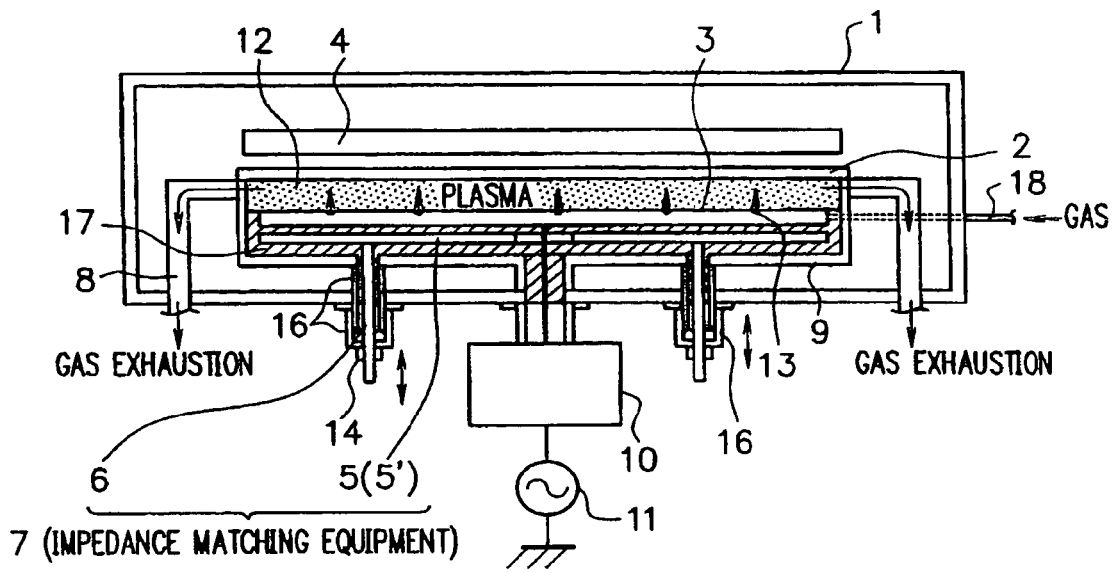
FIG. 3 is a schematic diagram illustrating the constitution of a third example of a plasma-processing apparatus of the present invention.
Figure 4:
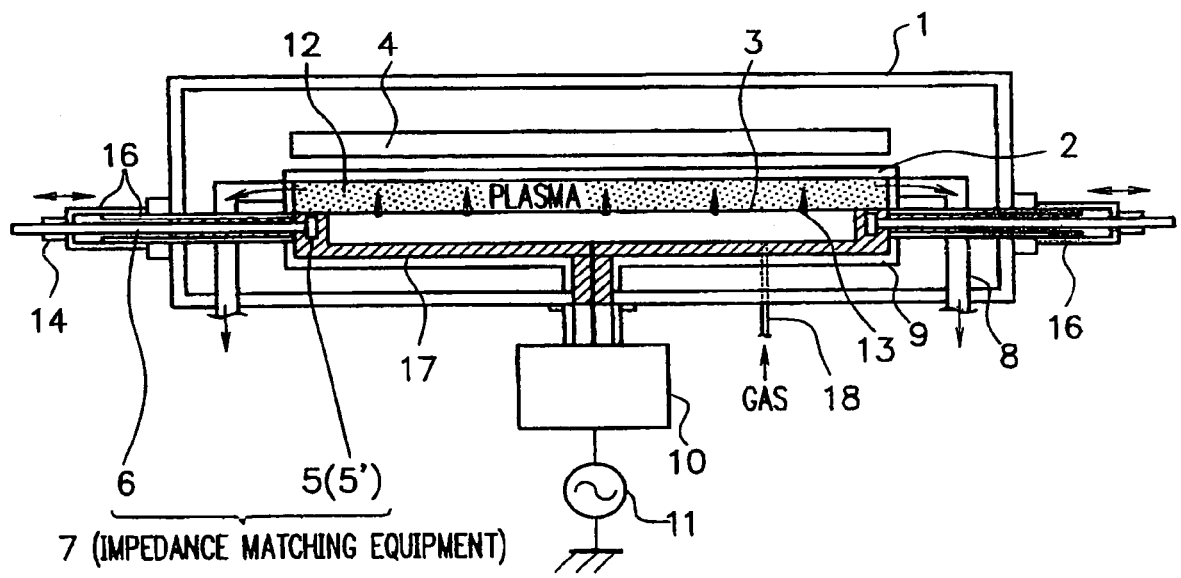
FIG. 4 is a schematic diagram illustrating the constitution of a fourth example of a plasma-processing apparatus of the present invention.

FIG. 1 is a schematic diagram illustrating the constitution of a first example of a plasma-processing apparatus of the present invention. FIG. 2 is a schematic diagram illustrating the constitution of a second example of a plasma-processing apparatus of the present invention. FIG. 3 is a schematic diagram illustrating the constitution of a third example of a plasma-processing apparatus of the present invention. FIG. 4 is a schematic diagram illustrating the constitution of a fourth example of a plasma-processing apparatus of the present invention. FIGS. 5(a) and 5(b) are schematic diagrams respectively illustrating an example of an earthed electrode comprising a substrate or a substrate retaining member used in any plasma-processing apparatus shown in FIGS. 1 to 4. FIGS. 6(a) and 6(b) are schematic diagrams for explaining the operation and constitution of the impedance-matching equipment in the plasma-processing apparatus shown in FIG. 1. FIG. 7 is a schematic diagrams for explaining the constitution of the matching equipment in the plasma-processing apparatus shown in FIG. 3.

In FIGS. 1 to 7, reference numeral 1 indicates a vacuum vessel, reference numeral 2 an earthed electrode comprising a substrate or a substrate retaining member [see, FIGS. 5(a) and 5(b)], reference numeral 3 a high frequency power application electrode, reference numeral 4 an electric heater, reference numeral 5 a conductor plate, which functions as a capacitive element 5', reference numeral 6 an inductive element, reference numeral 7 an impedance-matching equipment, reference numeral 8 an exhaust pipe, reference numeral 9 a shield case, reference numeral 10 a matching box, reference numeral 11 a high frequency power source capable of supplying VHF power, reference numeral 12 a reaction space, reference numeral 13 a gas spouting hole, reference numeral 14 a metal fixture, reference numeral 15 an insulator, reference numeral 16 a shield pipe, reference numeral 17 an insulator, and reference numeral 18 a gas introduction pipe extending from a gas supply system (not shown).

The high frequency power application electrode 3 is shaped in a plate form whose inside is hollowed and which is provided with a plurality of gas spouting holes 13 at the face thereof, which is exposed to the reaction space 12. The gas introduction pipe 18 is connected to the high frequency power application electrode 3 to open into the hallow space thereof. Gas is introduced into the hallow space of the high frequency power application electrode 3 through the gas introduction pipe 18 and the gas introduced in this way is spouted into the reaction space 13 though the gas spouting holes 13.

The high frequency power application electrode 3 functions to supply a VHF power, which is transmitted thereto from the high frequency power source 11 through the matching box 10 into the reaction space 12, where a discharge occurs to decompose the gas introduced into the reaction space 12, thereby generating plasma in the reaction space 12.

The exhaust pipe 8 communicates with the inside of the reaction space 12. The exhaust pipe 8 is provided with a control valve (not shown) and is connected to a vacuum pump (not shown). The exhaust pipe 8 serves to exhaust the gas in the reaction space 12 by means of the vacuum pump (not shown) connected thereto while adjusting the gaseous pressure inside the reaction space 12 by means of the control valve (not shown) provided at the exhaust pipe 8.

Now, a detailed description of the plasma-processing apparatus shown in FIGS. 1 and 2 will be provided.

In each of the plasma-processing apparatuses shown in FIGS. 1 and 2, the vacuum vessel 1 has the high frequency power application electrode 3 shaped in a plate form and the earthed electrode 2, which are arranged therein such that they are opposed to each other so as to establish the reaction space 12 between them. The clearances present between the high frequency power application electrode 3 and the circumferential wall of the vacuum vessel 1 are hermetically sealed so that the inside space, which include the reaction space 12 and which is circumscribed by the circumferential wall of the vacuum vessel 1 and the high frequency power application electrode 3, is kept in an air-tight state, where the side of the rear face of the high frequency power application electrode 3, which is opposite to the face thereof exposed to the reaction space 12, is situated on an atmospheric pressure side.

The high frequency power source 11 is electrically connected to the center of the rear face of the high frequency power application electrode 3 through the matching box 10, so that a VHF power from the high frequency power source 11 is supplied to the center of the high frequency power application electrode 3, followed by being supplied into the reaction space 12.

On the side of the rear face of the high frequency power application electrode 3, an impedance-matching equipment 7 is arranged.

In the embodiment shown in FIG. 1, the impedance-matching equipment 7 comprises a conductor plate 5 and four inductive elements 6, which are arranged such that the conductor plate 5 is held by the four inductive elements 6 arranged in parallel to each other in a longitudinal direction, where the four inductive elements 6 are connected to the conductor plate 5, respectively, in series.

The impedance-matching equipment 7 is arranged such that not only the conductor plate 5, but also the four inductive elements 6, respectively, become symmetrical to the center of the high frequency power application electrode 3, where the conductor plate 5 functions as a capacitive element 5' in relation to the high frequency power application electrode 3.

It is preferred that the conductor plate 5 is arranged substantially in parallel to the high frequency power application electrode 3. However, it is not always necessary to arrange the conductor plate 5 in this fashion. The conductor plate 5 may be arranged in another appropriate manner.

On the side of the rear face of the high frequency power application electrode 3, the shield case 9 is provided to enclose the space where the impedance-matching equipment 7 is arranged, so that VHF power released from the rear side of the high frequency power application electrode 3 is confined within the space enclosed by the shield case. The shield case 9 is provided with four holes, which allow the four inductive elements 6 to pass through so as to move up and down by means of a driving motor (not shown). At an external portion of each of the four holes of the shield case 9, a metal fixture 14 is provided so as to electrically ground the shield case 9 and each inductive element 6.

Similarly, in the embodiment shown in FIG. 2, the impedance-matching equipment 7 comprises two units respectively arranged on each of the opposite sides with respect to the center of the high frequency power application electrode 3. Each unit comprises a conductor plate 5 and two inductive elements 6, which are arranged such that the conductor plate 5 is held by the two inductive elements 6 arranged in parallel to each other in a longitudinal direction, where each of the two inductive elements 6 is connected to the conductor plate 5 in series. Each unit functioning as the impedance-matching equipment 7 is arranged such that not only the conductor plate 5, but also the two inductive elements 6 respectively become symmetrical to the center of the high frequency power application electrode 3, where the conductor plate 5 functions as a capacitive element 5' in relation to the high frequency power application electrode 3. In this case, it is also preferred that the conductor plate 5 is arranged substantially in parallel to the high frequency power application electrode 3.

As well as in the embodiment shown in FIG. 1, on the side of the rear face of the high frequency power application electrode 3, the shield case 9 is provided to enclose the space where the impedance-matching equipment 7 comprising aforesaid two units is arranged, so that VHF power released from the rear side of the high frequency power application electrode 3 is confined within the space enclosed by the shield case. The shield case 9 is provided with four holes, which allow the four inductive elements 6 of the two units to pass through so as to move up and down by means of a driving motor (not shown). At an external portion of each of the four holes of the shield case 9, a metal fixture 14 is provided so as to electrically ground the shield case 9 and each inductive element 6.

It is possible that the impedance-matching equipment 7 comprises a number of units having a configuration as described above. In this case, the impedance of the high frequency application electrode 3 can be more finely matched.

In the following, a description will be provided of an embodiment of the operation and the constitution of the impedance-matching equipment used in the plasma-processing apparatus of the present invention with reference to FIGS. 6(*a*) and 6(*b*).

FIG. 6(*a*) is a schematic diagrams for explaining the operation of the impedance-matching equipment in the plasma-processing apparatus shown in FIG. 1. FIG. 6(*b*) is a schematic diagram for detailing the structure of the impedance-matching equipment shown in FIG. 6(*a*), where an upper figure is a schematic elevation view of the impedance-matching equipment and a lower figure is a schematic underside view of the impedance-matching equipment.

FIG. 6(*a*) shows an embodiment when the impedance-matching equipment 7 arranged on the side of the rear face of the high frequency power application electrode 3 is moved down by the driving motor (not shown). FIG. 6(*b*) details the constitution of the impedance-matching equipment 7.

As FIG. 6(*b*) illustrates, the impedance-matching equipment 7 comprising the conductor plate 5 (which is arranged substantially in parallel to the high frequency power application electrode 3) and the four inductive elements 6 shaped in a bar-like form (which are arranged in parallel to each other and are collected to the conductor plate 5 in series connection) is arranged on the side of the rear face of the high frequency power application electrode 3, where capacitive coupling is established between the conductor plate 5 and the high frequency power application electrode 3, whereby the conductor plate 5 is made to function as a capacitive element 5'. The capacitance of the capacitive element 5' depends on the interval between the conductor plate 5 and the high frequency power application electrode 3. The opposite end portions of the four inductive elements 6 are fastened by being passed through the four holes of the shield case 9, where the joining portions of the opposite end portions of the inductive elements 6 with the shield case 9 are short-circuited by electrically grounding the joining portions using the metal fixtures 14, where the inductance of the inductive elements 6 is decided depending on the length L of the inductive elements 6 between the conductor plate 5 and the short-circuited joining portions of the inductive elements 6 with the shield case 9.

Because a VHF power from the high frequency power source is applied to the center of the rear face of the high frequency power application electrode 3, the impedance-matching equipment 7 is arranged such that it becomes symmetrical to the center of the high frequency power application electrode 3. When the impedance-matching equipment 7 is moved up or down, in accordance with the movement of the impedance-matching equipment 7, the capacitance of the capacitive element 5' and the inductance of the inductive element 6 are changed.

In the case where from the side of the matching box 10, the impedance-matching equipment 7 is considered as an electric circuit, it can be said that the impedance-matching equipment 7 is connected with the capacitance of the high frequency power application electrode 3 in parallel, forming a parallel resonance circuit. Thus, it is considered that by moving the impedance-matching equipment 7 up or down, so as to match with a parallel resonance point, the capacitance of the high frequency power application electrode 3 is cancelled so that it can be deemed to have infinite resistance. In this connection, it is considered that the impedance of the high frequency power application electrode 3 becomes a resistance component substantially due to a plasma generated in the reaction space, and therefore, the reactive current of the high frequency power application electrode 3 is decreased and the joule loss in the power supply path from the matching box 10 to the high frequency power application electrode 3 is diminished.

Here, in the case where a VHF power is supplied to the high frequency power application electrode 3, because the high frequency power application electrode is considered as a distributed constant circuit, when the impedance-matching equipment 7 is arranged such that it is asymmetrical to the center of the high frequency power application electrode 3, the VHF power is supplied such that it is localized at the face of the high frequency power application electrode 3. Therefore, by arranging the impedance-matching equipment 7 such that it is symmetrical to the center of the high frequency power application electrode 3, it is possible to prevent the capacitance of the high frequency power application electrode from being localized.

Now, in the plasma-processing apparatus shown in FIG. 6(a) (which is corresponding to FIG. 1), a desired gas is supplied into the high frequency power application electrode 3 (which is a plate form with its inside hollowed out, as previously described) through the gas introduction pipe 18 and the gas thus introduced into the high frequency power application electrode 3 is supplied into the reaction space 12 through the spouting holes 13 provided at the high frequency power application electrode 3. Simultaneously with this, VHF power from the high frequency power source is supplied to the center. VHF power from the high frequency power source 11 is supplied to the high frequency power application electrode 3 from the center of the rear face thereof and is then supplied into the reaction space 12, whereby plasma is generated in the reaction space. In this case, the impedance of the high frequency power application electrode 3 is adjusted by changing the position of the impedance-matching equipment 7 by moving the impedance-matching equipment up or down, as shown in FIG. 6(a), so that the emission intensity of the plasma generated in the reaction space 12 is increased. The exhausting of the gas from the reaction space is performed through the exhaust pipe 8.

In the above, the introduction of the gas into the reaction space is carried out though the gas spouting holes of the high frequency power application electrode. However, this is not a limiting embodiment. It is possible to introduce this gas into the reaction space from a peripheral portion of the reaction space.

In the case where it is intended to form a deposited film, by using a film-forming gas as the gas to be supplied into the reaction space and using a metallic substrate as the earth electrode 2, as shown in FIG. 5(a), or a substrate retaining member made of a metallic material having a glass substrate retained thereon, as shown in FIG. 5(b), as the earth electrode 2, the deposited film can be formed on the metallic substrate or the glass substrate. In this case, the film formation is carried out by adjusting the position of the impedance-matching equipment 7 with reference to the thickness distribution of the deposited film formed on the substrate functioning as the earth electrode.

Separately, in the case where it is intended to subject a given member to a plasma-etching treatment, by using an etching raw material gas as the gas to be supplied into the reaction space and using the member "as is" as the earth electrode 2 when the member is electrically conductive or a substrate retaining member made of a metallic material having the member retained thereon, as shown in FIG. 5(b), as the earth electrode 2, when the member is not electrically conductive, the surface of the member can be plasma-etched. In this case, the etching treatment is carried out by adjusting the position of the impedance-matching equipment 7 with reference to the etched state of the member functioning as the earth electrode.

Now, in the plasma-processing apparatus shown in FIGS. 1 and 2, the rear face side of the high frequency power application electrode 3 is situated at atmospheric pressure and there is a space between the high frequency power application electrode and the impedance-matching equipment 7. Therefore, no abnormal discharge occurs between the high frequency power application electrode 3 and the impedance-matching equipment 7, as well as also between the impedance-matching equipment 7 and the shield case 9.

A description will be provided of the plasma-processing apparatus shown in FIGS. 3 and 4.

Each of the plasma-processing apparatuses shown in FIGS. 3 and 4 is a partial modification of the plasma-processing apparatus shown in FIG. 1 in that the high frequency power application electrode 3 is entirely situated in a reduced pressure atmosphere. Particularly, in each of the plasma-processing apparatus shown in FIGS. 3 and 4, the clearances present between the conductor plate 5 of the impedance-matching equipment 7, the high frequency power application electrode 3 and the wall of the shield case 9 are filled with an insulating material 17, where the conductor plate 5 is insulated from the high frequency power application electrode 3 through the insulating material 17 provided between them.

In the plasma-processing apparatus shown in FIG. 3, the impedance-matching equipment 7 comprising the conductor plate 5 (which functions as a capacitive element 5' in relation to the high frequency power application electrode 3) and the four inductive elements 6 shaped in a bar-like form, which are connected to the conductor plate 5 in series, is arranged on the side of the rear face of the high frequency power application electrode 3, as well as in the case of the plasma-processing apparatus shown in FIG. 1.

In the plasma-processing apparatus shown in FIG. 3, each inductive element 6 has a first portion situated inside the shield case 9, which is filled with the insulating material 17, and a second portion inserted in a double-structured shield pipe 16, which comprises a non-movable inner pipe and an outer pipe capable of being slidably moved and which is provided to hermetically penetrate the circumferential wall of the vacuum vessel 1, so as to project outside the vacuum vessel 1, where the clearance between the part of the second portion, which is situated in the inner pipe of the shield pipe 16, and said inner pipe is filled with an extended portion of the insulating material 17 filled in the inside of the shield case 9. An end portion of the second portion of the inductive element 6 is short-circuited by electrically grounding by metal fixture 14 fixed to the shield pipe 16, as shown in FIG. 3. The aforesaid clearance is not necessarily always filled with the insulating material 17. That is, in the case where the clearance between the inner pipe and the second portion of the inductive element 6 is less than 3 mm where no discharge occurs, it is not necessary for the clearance to be filled with the insulating material 17.

In the plasma-processing apparatus shown in FIG. 4, the impedance-matching equipment 7 comprising the conductor plate 5 (which functions as a capacitive element 5' in relation to the high frequency power application electrode 3) and the one inductive element 6 shaped in a bar-like form, which is connected to the conductor plate 5 in series, is arranged at each of the opposite end sides of the high frequency power application electrode 3.

In the plasma-processing apparatus shown in FIG. 4, each inductive element 6 has a first portion situated inside the shield case 9, which is filled with the insulating material 17, and a second portion, which is inserted in a double-structured shield pipe 16 comprising a non-movable inner pipe and an outer pipe capable of being slidably moved and which is provided to hermetically penetrate the circumferential wall of the vacuum vessel 1, so as to project outside the vacuum vessel 1, where the clearance between the part of said second portion, which is situated in the inner pipe of the shield pipe 16, and said inner pipe is filled with an extended portion of the insulating material 17 filling the inside of the shield case 9. An end portion of the second portion of the inductive element 6 is short-circuited by electrically grounding by the metal fixture 14 fixed to the shield pipe 16, as shown in FIG. 4. It is not always necessary to fill the aforesaid clearance with the insulating material 17. That is, in the case where the clearance between the inner pipe and the second portion of the inductive element 6 is less than 3 mm, where no discharge occurs, it is not necessary for the clearance to be filled with the insulating material 17.

With reference to FIG. 7, the impedance-matching equipment 7 in the plasma-processing apparatus shown in FIG. 3 will be detailed.

Capacitive coupling is established between the high frequency power application electrode 3 and the conductor plate 5, which is arranged substantially in parallel to the high frequency power application electrode 3, whereby the conductor plate 5 functions as a capacitive element 5' and where the inductive element 6 is connected to the conductor plate 5 in series. For the double-structured shield pipe 16, one end portion of the outer pipe thereof is short-circuited with the inner pipe thereof, which is electrically grounded by a spring plate and the other end portion of the outer pipe is short-circuited with the inductive element 6 by electrical grounding using a spring plate. By slidably moving the outer pipe up or down, the length L of the inductive element is changed, whereby the inductance of the inductive element 6 is adjusted. Here, the clearances present between the conductor plate 5 of the impedance-matching equipment 7, the high frequency power application electrode 3 and the wall of the shield case 9 are filled with the insulating material 17. The clearance present between the inductive element 6 and the inner pipe of the double-structured shield pipe 16 is also filled with the insulating material 17 as shown in FIG. 7.

By providing the above structure, it is possible to match the impedance of the high frequency power application electrode 3, so as to cancel the conductive component of the high frequency power application electrode. This makes it possible to effectively and evenly supply the VHF power supplied to the high frequency power application electrode 3 into the reaction space 12, where a high density plasma is uniformly generated, without problems, such as an abnormal discharge, overheating, and breakage at the power supply portion and the like of the high frequency power application electrode.

It is also possible to efficiently form a high quality deposited film having a uniform thickness over a large area at a high deposition rate by adjusting the frequency of a high frequency power supplied to the high frequency power application electrode, the internal gas pressure of the reaction space, the interval between the high frequency power application electrode and the counter electrode (the earth electrode), and the flow rate of the gas introduced into the reaction space.

In the following, the findings obtained by the present inventors through experiments in the course of completing the present invention will be described.

In order to increase the density of generated plasma to achieve a high film deposition rate, it is necessary to supply a high frequency power with a frequency belonging to a VHF band region (that is, a VHF power) to a film-forming raw material gas introduced in the discharge space (the reaction space) through the high frequency power application electrode to decompose the raw material gas, thereby producing a large amount of radicals.

Now, using a plasma-processing apparatus structured in the same way as in FIG. 1, the present inventors examined emission intensity of plasma generated in the plasma generation region (that is, the reaction space) of the plasma-processing apparatus.

The plasma-processing apparatus has a vacuum vessel (1) with a reaction space (12) formed between a high frequency power application electrode (3) and an earth electrode (2), which are arranged in the vacuum vessel such that they are opposed to each other. The high frequency power application electrode (3) has a face exposed to the reaction space. The vacuum vessel further has impedance-matching equipment (7) on the side of the rear face of the high frequency power application electrode (3), which is exposed to atmospheric pressure and atmosphere reaction space (12) such that the impedance-matching equipment (7) is arranged between the high frequency power application electrode (3) and a shield case (9) provided to shield the space including the impedance-matching equipment (7) arranged therein, such that the impedance of the high frequency power application electrode (3) becomes symmetrical to the center of the high frequency power application electrode. The impedance-matching equipment (7) comprises a conductor plate (5) and four inductive elements (6) shaped in a bar-like form, which are connected to the conductor plate (5) in series. The conductor plate (5) of the impedance-matching equipment (7) is arranged substantially in parallel to the high frequency power application electrode (3), such that the conductor plate (5) extends along substantially the entire region of the rear face of the high frequency power application electrode (3) to establish capacitive coupling with the high frequency power application electrode (3), wherein the conductor plate functions as a capacitive element (5'), and the opposite end portions of the four inductive elements (6) of the impedance-matching equipment (7) are electrically grounded through the shield case (9) and by metal fixtures 14.

The emission intensity of plasma generated in the reaction space (12) was measured from the face of the earth electrode (2), which is exposed to the reaction space (12), using an optical fiber and a plasma emission spectrometer.

As a result, the findings described below were obtained.

The constant of the capacitive element (5') formed between the high frequency power application electrode (3) and the conductor plate (5) to the inductive element (6) was adjusted to given values by moving the impedance-matching equipment (7) arranged between the high frequency power application electrode (3) and the shield case (9) up and down, where the emission intensity of plasma generated in the reaction space (12) was examined with respect to each of the adjusted values.

As a result, there was obtained a finding that the emission intensity of plasma generated in the reaction space increases and becomes uniform when the constant of the capacitive element (5') to the inductive element (6) is adjusted as described above.

The present inventors deemed the reason for this to be that the front face of the high frequency power application electrode (3) has a resistance component and the high frequency power application electrode (3) functions as a distributed constant circuit having a capacitive component and an inductive component in parallel.

Based on this thought, the present inventors conducted an examination by making the position where the capacitive element (5') and the inductive element (6), which are connected in series, are arranged to be asymmetrical about the center of the high frequency power application electrode (3). As a result, it was found that the electric current flowing in the high frequency power application electrode (3) becomes uneven, influencing the uniformity of plasma generated in the reaction space (12).

Taking the above findings into consideration, the present inventors invented a plasma-processing apparatus comprising a vacuum vessel having a reaction space formed between a high frequency power application electrode shaped in a plate form and an earth electrode, which are arranged in the vacuum vessel such that they are opposed to each other. The high frequency power application electrode was designed to have a face exposed to the reaction space, wherein between the other face of the high frequency power application electrode, excluding the face exposed to the reaction space, and a conductor with the earth potential comprising at least a part of the circumferential wall of the vacuum vessel, an impedance-matching equipment comprising a capacitive element and an inductive element, which are mutually connected in series and arranged so that each capacitive element and inductive element of the impedance-matching equipment becomes symmetrical to the center of the high frequency power application electrode.

This plasma-processing apparatus was found to have such advantages as will be described below.

By adjusting the position of the impedance-matching equipment in an upward or downward direction, it is possible to achieve a parallel resonance between the capacitive component of the high frequency power application electrode and the inductive component of the impedance-matching equipment. This greatly diminishes the reactive current flowing between the high frequency power application electrode and a matching box, which is electrically connected to a high frequency power source and also to the high frequency power application electrode. This makes it possible to uniformly supply a large high frequency power with a frequency belonging to a VHF band region (that is, a VHF power) to the entire face of the high frequency power application electrode, which faces the reaction space, so that the VHF power is uniformly supplied to the raw material gas introduced in the reaction space or plasma generated in the reaction space, whereby plasma having a high density is uniformly generated in the entire region of the reaction space.

Because plasma having a high density is uniformly generated in the reaction space as described above, a high quality deposited film is formed over the entire surface of a substrate, which functions as the earth electrode, at a uniform thickness and at a high deposition rate.

The present invention also provides a method of forming a deposited film using the aforesaid plasma-processing apparatus. It is a matter of course that this method is effective in forming a deposited film using a high frequency power with a frequency of 13.56 MHz. However, this method is significantly effective particularly in the case of forming a deposited film using VHF power.

Specifically, as described above, by adopting the constitution in the plasma-processing apparatus in which, between the other face of the high frequency power application electrode, excluding the face exposed to the reaction space, and the conductor with earth potential comprising at least part of the circumferential wall of the vacuum vessel, the impedance-matching equipment comprising the capacitive element and the inductive element, which are mutually connected in series, is arranged such that each of the capacitive element and the inductive element of the impedance-matching equipment becomes symmetrical to the center of the high frequency power application electrode, and plasma having a high density is uniformly generated in the entire region of the reaction space even when the reaction space has a large area. Further, in the case where a large high frequency power (that is, VHF power) is applied to the high frequency power application electrode of the conventional plasma-processing apparatus, the dielectric loss is significant. However, in the plasma-processing apparatus of the present invention, such a dielectric loss is greatly diminished. Because of this, even when a large high frequency power, namely, VHF power is used, it possible to generate a large power plasma.

Separately, in the case where film formation is performed by the plasma-processing apparatus of the present invention using VHF power, it is possible to realize high-speed film formation in a large area reaction space, where a high-quality large area non-crystalline or crystalline silicon deposited film having greatly improved properties can be formed at a satisfactorily high deposition rate.

In addition, the plasma-processing apparatus can be used as a sputtering apparatus or an etching apparatus, where a large area member can be efficiently plasma-processed.

In the following, the present invention will be described in more detail with reference to examples. It should be understood that these examples are only for illustrative purposes and the scope of the present invention is not restricted by these examples.

Example 1

In this example, the state of plasma generated in the plasma-processing apparatus shown in FIG. 1 will be described.

In the plasma-processing apparatus shown in FIG. 1, as previously explained, the high frequency power application electrode 3 is arranged such that the front face thereof is exposed to the reaction space 12, which is formed between the front face and the earth electrode 2, arranged to oppose the high frequency power application electrode 3, and the rear face thereof is exposed to atmospheric pressure. The atmospheric pressure side of the rear face of the high frequency power application electrode 3 is enclosed by the shield case 9.

In the space enclosed by the shield case 9, the impedance-matching equipment 7 comprising one conductor plate 5 shaped in a plate form and four inductive elements 6 shaped in a bar form, which are connected to the conductor plate 5 in series, is arranged such that the conductor plate 5 and the four inductive elements 6 are symmetrical to the center of the rear face of the high frequency power application electrode 3.

Particularly, the conductor plate 5 is arranged substantially in parallel to the high frequency power application electrode 3, where the conductor plate 5 functions as a capacitive element 5' in relation to the high frequency power application electrode 3. Each of the four inductive elements 6 comprises a bar-shaped inductive element whose diameter is 16 mm, and these four inductive elements 6 are arranged such that they are symmetrical to the center of the conductor plate 5, where one of each of their ends is connected to the conductor plate 5, so as to retain the conductor plate 5 from the backside thereof. To be more specific, two of the four inductive elements are arranged on each of the opposite sides with respect to the center of the conductor plate 5.

The other end portions of the four inductive elements 6 thus arranged are made to penetrate through the four holes provided at the shield case 9, where they are electrically grounded by means of the metal fixtures 14 provided at the four holes of the shield case 9 to establish a parallel connection with the capacitive component of the high frequency power application electrode 3.

Here, by moving the impedance-matching equipment 7 constituted as described above in an upward or downward direction, it is possible to change the impedance, so as to generate parallel resonance with the capacitive component of the high frequency power application electrode 3.

Using the plasma-processing apparatus shown in FIG. 1, which is constituted as described above, plasma generation and distribution were observed as described below.

The size of the reaction space 12 was set to 540 mm×890 mm, and the size of the high frequency power application electrode 3 was set to 500 mm×850 mm.

$H_2$ gas was introduced into the reaction space at a flow rate of 1000 sccm through the spouting holes 13 of the high frequency power application electrode 3, and the inner pressure (the gas pressure) in the reaction space 12 was maintained at 266 Pa. Then, VHF power at a frequency of 60 MHz having a wattage of 3 KW was supplied to the high frequency power application electrode 3 and is then supplied into the reaction space, whereby plasma was generated in the reaction space 12. The emission intensity of the plasma generated in the reaction space 12 and the distribution thereof were examined at 15 points over the surface of the earth electrode 2, which faces the reaction space by means of a plasma emission spectrometer MAX 3000 produced by ATAGOBUSSAN Kabushiki Kaisha.

Figure 8:
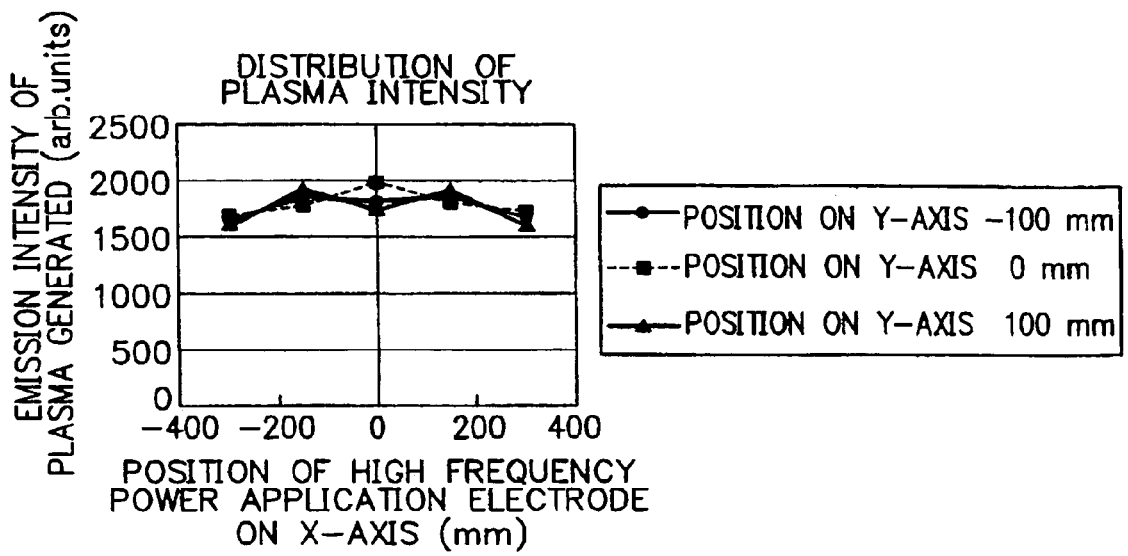
FIG. 8 is a graph showing plasma emission intensity distributions in Example 1, which will be described later.

The examined results obtained are graphically shown in FIG. 8. In FIG. 8, the abscissa indicates positions of the high frequency power application electrode and the ordinate indicates emission intensities of the generated plasma. (0, 0) of the coordinate (X, Y) corresponds to the center position of the high frequency power application electrode.

Based on the results shown in FIG. 8, it was found that plasma emission intensities varied by ±10%. This means that substantially uniform and stable plasma having a strong emission intensity is obtained over the entire region of the reaction space. Separately, neither overheating at the power introduction portion of the high frequency power application electrode nor abnormal discharge occurred during plasma generation.

Example 2

In this example, the state of plasma generated in the plasma-processing apparatus shown in FIG. 3 will be described.

As previously described, the plasma-processing apparatus shown in FIG. 3 is a partial modification of the plasma-processing apparatus shown in FIG. 1 in that the high frequency power application electrode 3 is entirely situated in a reduced pressure atmosphere. Particularly, in the plasma-processing apparatus shown in FIG. 3, the clearances present between the conductor plate 5 of the impedance-matching equipment 7, the high frequency power application electrode 3 and the wall of the shield case 9 are filled with an insulating material 17, where the conductor plate 5 is insulated from the high frequency power application electrode 3 through the insulating material 17 provided between them. The impedance-matching equipment 7 is arranged on the side of the rear face of the high frequency power application electrode 3, as well as in the plasma-processing apparatus shown in FIG. 1. The impedance-matching equipment 7 comprises one conductor plate 5 shaped in a plate form and four inductive elements 6 shaped in a bar form, which are connected to the conductor plate 5 in series, is arranged such that the conductor plate 5 and the four inductive elements 6 are symmetrical to the center of the rear face of the high frequency power application electrode 3.

Particularly, the conductor plate 5 is arranged substantially in parallel to the high frequency power application electrode 3, where the conductor plate 5 functions as a capacitive element 5' in relation to the high frequency power application electrode 3. Each of the four inductive elements 6 comprises a bar-shaped inductive element whose diameter is 16 mm, and these four inductive elements 6 are arranged such that they are symmetrical to the center of the conductor plate 5, where one of each of their ends is connected with the conductor plate 5 so as to retain the conductor plate 5 from the backside thereof. Two of the four inductive elements are arranged on each of the opposite sides with respect to the center of the conductor plate 5. With respect to the four inductive elements, their impedance can be adjusted by ascending or descending the outer pipes of the double-structured shield pipes 16 outside the vacuum vessel 1, as previously described.

Using the plasma-processing apparatus shown in FIG. 3, which is constituted as above described, the generation of plasma and the distribution of the plasma were observed as described below.

The size of the reaction space 12 was set to 510 mm×510 mm, and the size of the high frequency power application electrode 3 was set to 500 mm×850 mm. The interval between the earth electrode 2 and the high frequency power application electrode 3, which are mutually opposed through the reaction space 12, was set to 10 mm.

$H_2$ gas was introduced into the reaction space at a flow rate of 1000 sccm through the spouting holes 13 of the high frequency power application electrode 3, and the inner pressure (the gas pressure) in the reaction space 12 was maintained at 133 Pa. Then, VHF power at a frequency of 100 MHz having a wattage of 3 KW was supplied to the high frequency power application electrode 3, followed by being supplied into the reaction space, whereby plasma was generated in the reaction space 12. The emission intensity of the plasma generated in the reaction space 12 and the distribution thereof were examined at 9 points over the surface of the earth electrode 2, which faces the reaction space by means of a plasma emission spectrometer MAX 3000 produced by ATAGO-BUSSAN Kabushiki Kaisha.

Figure 9:
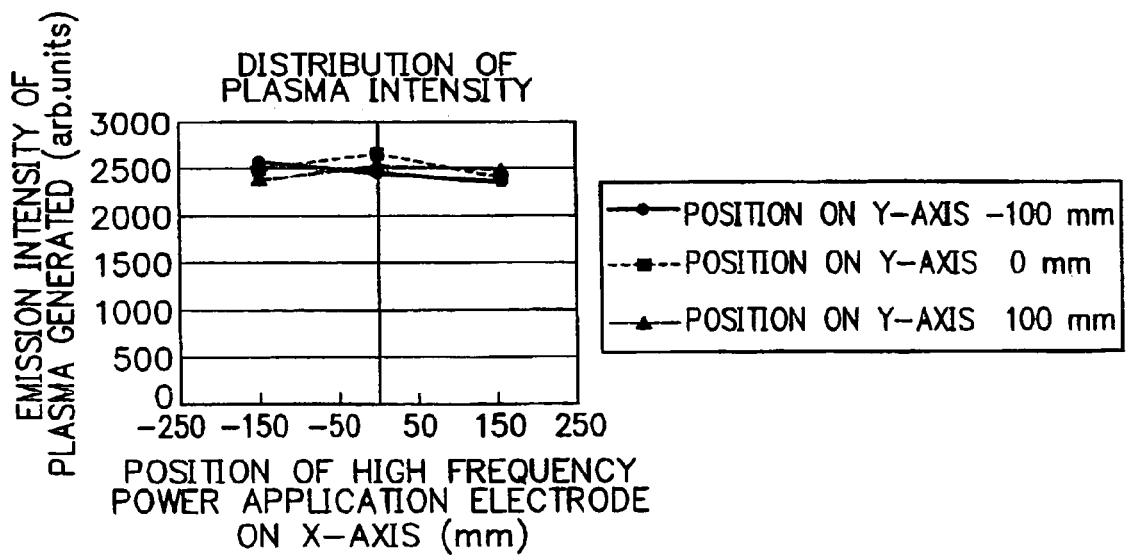
FIG. 9 is a graph showing plasma emission intensity distributions in Example 2, which will be described later.

The examined results obtained are graphically shown in FIG. 9. In FIG. 9, the abscissa indicates positions of the high frequency power application electrode and the ordinate indicates emission intensities of the generated plasma. (0, 0) of the coordinate (X, Y) corresponds the center position of the high frequency power application electrode.

Based on the results shown in FIG. 9, it was found that plasma emission intensities vary by ±6%. This means that substantially uniform and stable plasma having a strong emission intensity is obtained over the entire region of the reaction space. Separately, neither overheating at the power introduction portion of the high frequency power application electrode nor abnormal discharge occurred during the plasma generation.

Example 3

In this example, using the plasma-processing apparatus shown in FIG. 1 whose constitution is substantially the same as that in Example 1, except for using a substrate retaining member made of a metallic material and having a configuration shown in FIG. 5(b) as the earth electrode 2, an amorphous silicon film was formed on a substrate [2', see FIG. 5(b)] comprising a 7059 glass plate (produced by Corning Company) retained by the substrate retaining member as the earth electrode 2.

The interval between the earth electrode 2 (the glass plate) and the high frequency power application electrode 3, which are mutually opposed through the reaction space 12, was set to 10 mm. The position of the impedance-matching equipment 7 was adjusted to and fixed at a position where the emission intensity of plasma generated in the reaction space 12 achieves a maximum value.

The formation of the amorphous silicon film on the 7059 glass plate was performed as described below.

The inside of the reaction space 12 was evacuated to less than 0.1 Pa. After this, Ar gas was introduced into the reaction space through the spouting holes 13 of the high frequency power application electrode 3, and the inner pressure (the gas pressure) in the reaction space 12 was adjusted to and maintained at 133 Pa. Then, the 7059 glass plate was heated to and maintained at 200° C. by means of the heater 4. Thereafter, the introduction of the Ar gas into the reaction space 2 was terminated, followed by introducing $SiH_4$ gas and $H_2$ gas into the reaction space 12 at respective flow rates of 1000 sccm and 1000 sccm, and the inner pressure (the gas pressure) in the reaction space 12 was adjusted to and maintained at 266 Pa. Then, VHF power at a frequency of 60 MHz having a wattage of 3 KW was supplied to the high frequency power application electrode 3, followed by being supplied into the reaction space 12, whereby plasma was generated in the reaction space to cause film formation on the 7059 glass plate. This operation was continued for 5 minutes, whereby an amorphous silicon film was formed on the 7059 glass plate.

For the amorphous silicon film thus formed on the 7059 glass plate, the thicknesses at 21 positions thereof, which correspond to prescribed 21 positions of the face (which is exposed to the reaction space 12) of the high frequency power application electrode 3 in the longitudinal direction, were measured. Based on the film thicknesses measured in this manner, film deposition rates at the 21 positions were computed. The computed film deposition rates are graphically shown in FIG. 10, where three film deposition rate distribution curves are established as shown in FIG. 10.

In FIG. 10, the abscissa (X) indicates positions of the high frequency power application electrode 3 in the longitudinal direction and the ordinate (Y) indicates film deposition rates at prescribed positions of the substrate in the width direction.

Based on the three film deposition rate distribution curves in FIG. 10, it was found that the film deposition rate varied by ±8%, which is satisfactory.

Separately, based on the film deposition rates at the 21 positions, an average film deposition rate was computed. As a result, the average film deposition rate was found to be 67 Å/sec, which is satisfactory.

The above results indicate that a deposited film can be formed over a large area at a substantially uniform thickness and at a satisfactorily high deposition rate.

Separately, neither overheating at the power introduction portion of the high frequency power application electrode nor abnormal discharge occurred during the film formation.

Comparative Example 1

In this comparative example, using a modification of the plasma-processing apparatus shown in FIG. 2 in that one of the two impedance-matching equipments was omitted, and in accordance with the film-forming procedures in Example 3, an amorphous silicon film was formed on a 7059 glass plate.

For the amorphous silicon film thus formed on the 7059 glass plate, the thicknesses at 21 positions thereof, which correspond to the prescribed 21 positions of the face (which is exposed to the reaction space 12) of the high frequency power application electrode 3 in the longitudinal direction, were measured. Based on the film thicknesses measured in this manner, film deposition rates at the 21 positions were computed. The computed film deposition rates are graphically shown in FIG. 11, where three film deposition rate distribution curves are established.

In FIG. 11, the abscissa (X) indicates positions of the high frequency power application electrode 3 in the longitudinal direction and the ordinate (Y) indicates film deposition rates at prescribed positions of the substrate in the width direction.

Based on the three film deposition rate distribution curves, it was found that the film deposition rate varied by ±45%, which is clearly inferior to that (+8%) in Example 3.

Separately, based on the film deposition rates at the 21 positions, an average film deposition rate was computed. As a result, the average film deposition rate was found to be 56 Å/sec, which is clearly inferior to that (67 Å/sec) in Example 3.

As described in the above, the plasma-processing apparatus of the present invention has significant advantages in that uniform VHF plasma is stably and continuously generated. This plasma is uniformly distributed in the entire region of the reaction space at a uniform density. Therefore, a high quality deposited film, such as a non-crystalline silicon deposited film or a crystalline silicon deposited film, which is free of defects, is formed over the entire surface of a large area substrate at a uniform thickness and at a satisfactorily high deposition rate.

What is claimed is:

1. A plasma-processing apparatus comprising:
  a vacuum vessel having a reaction space formed between a high frequency power application electrode and an earth electrode, which are arranged in said vacuum vessel such that they are opposed to each other, said high frequency power application electrode having a face exposed to said reaction space;

a matching box electrically connected to a high frequency power source and to the high frequency power application electrode; and an impedance matching equipment, which is not in a power supply line, comprising one or more capacitive and inductive elements mutually connected in series, arranged between a face of the high frequency power application electrode other than the face exposed to the reaction space and a conductor with earth potential comprising at least part of the circumferential wall of said vacuum vessel such that each of the one or more capacitive elements is either itself symmetrical about a center of the high frequency power application electrode or is symmetrical to another capacitive element from the one or more capacitive elements about the center of the high frequency power application electrode, wherein power in a VHF band region from the high frequency power source is supplied to said high frequency power application electrode to generate a plasma in said reaction space, wherein the impedance matching equipment reduces a reactive current flowing between the matching box and the high frequency power application electrode, and wherein a parallel resonance occurs between a capacitive component of the high frequency power application electrode and an inductive component of the impedance matching equipment, wherein each of the one or more inductive elements is electrically grounded via the conductor and passes through a hole in said conductor and is slidably movable to adjust an impedance of the high frequency power application electrode.

2. The plasma-processing apparatus according to claim 1, wherein the side of the rear face of said high frequency power application electrode is exposed to an atmosphere of atmospheric pressure, and between the rear face of said high frequency power application electrode and said conductor which is situated in said atmosphere of atmospheric pressure, said impedance matching equipment is arranged in series.

3. The plasma-processing apparatus according to claim 2, wherein said impedance matching equipment is made such that it is capable of moving in parallel to said high frequency power application electrode.

4. The plasma-processing apparatus according to claim 3, wherein said impedance matching equipment comprises a plurality of impedance matching equipments.

5. The plasma-processing apparatus according to claim 2, wherein said impedance matching equipment comprises a plurality of impedance matching equipments.

6. The plasma-processing apparatus according to claim 1, wherein said impedance matching equipment is made such that it is capable of moving in parallel to said high frequency power application electrode.

7. The plasma-processing apparatus according to claim 6, wherein said impedance matching equipment comprises a plurality of impedance matching equipments.

8. The plasma-processing apparatus according to claim 1, wherein said impedance matching equipment comprises a plurality of impedance matching equipments.

* * * * *